(12) United States Patent
Takai

(10) Patent No.: US 7,330,383 B2
(45) Date of Patent: Feb. 12, 2008

(54) SEMICONDUCTOR DEVICE WITH A PLURALITY OF FUSE ELEMENTS AND METHOD FOR PROGRAMMING THE DEVICE

(75) Inventor: Tomohisa Takai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/356,262

(22) Filed: Feb. 17, 2006

(65) Prior Publication Data

US 2006/0193185 A1    Aug. 31, 2006

(30) Foreign Application Priority Data

Feb. 17, 2005    (JP) .................... P2005-041078

(51) Int. Cl.
*G11C 29/00* (2006.01)
(52) U.S. Cl. ............... 365/200; 365/225.7; 365/189.07
(58) Field of Classification Search ............ 365/225.7, 365/200, 201, 189.07
See application file for complete search history.

(56) References Cited

U.S. PATENT DOCUMENTS

| 6,418,069 B2 | 7/2002 | Schamberger et al. | |
| 6,856,569 B2 * | 2/2005 | Nelson et al. | 365/225.7 |
| 6,922,649 B2 * | 7/2005 | Mondal et al. | 702/117 |
| 2005/0050421 A1 * | 3/2005 | Enkaku | 714/735 |
| 2006/0077732 A1 * | 4/2006 | Hojo | 365/200 |
| 2006/0193185 A1 | 8/2006 | Takai | |

FOREIGN PATENT DOCUMENTS

| JP | 11-86588 | 3/1999 |
| JP | 2000-207896 | 7/2000 |

OTHER PUBLICATIONS

Ouellette, M.R., "Shared Fuse Macro for Multiple Embedded Memory Devices with Redundancy", IBM, Microelectronics Division, ASIC Development, 2001 IEEE (0-7803-7076-7/01); 4 pages.
U.S. Appl. No. 11/503,295, filed Aug. 14, 2006, Takai et al.

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A device and method for programming the semiconductor device that includes a plurality of first fuse-sets which store first information, wherein each of the first fuse-sets includes at least one first fuse element and the first information has been compressed, a second fuse-set including at least one second fuse element which stores data modification information used to modify the first information and an information creation circuit which modifies the first information based on the data modification information, expands the modified first information and thereby creates second information.

20 Claims, 20 Drawing Sheets

(a)

| RWL0 | RWL1 | RWL2 | RWL3 | RWL4 | RWL5 |
|---|---|---|---|---|---|
| E876543210 | E876543210 | E | E876543210 | E | E876543210 |
| 1001110001 | 1101010010 | 0 | 1000101101 | 0 | 1011111001 |

Programming error

| BDAAA |
|---|
| 10010 |
| BDAAA |
| 00000 |
| ⋮ |

Expansion (b)

| RWL0 | RWL1 | RWL2 | RWL3 | RWL4 | RWL5 |
|---|---|---|---|---|---|
| E876543210 | E876543210 | E876543210 | E876543210 | E876543210 | E876543210 |
| 1001110001 | 1101010010 | 0000000000 | 1000101101 | 0000000000 | 1011111001 |

SEMICONDUCTOR DEVICE WITH A PLURALITY OF FUSE ELEMENTS AND METHOD FOR PROGRAMMING THE DEVICE

CROSS REFERENCE TO RELATED APPLICATION

This application is based upon and claims the benefit of priority from the prior Japanese Patent Application No. JP2005-41078 filed on Feb. 17, 2005, the entire contents of which is incorporated herein by reference.

FIELD OF THE INVENTION

The present invention relates to a semiconductor device with a plurality of fuse elements, and more specifically to a semiconductor device with a plurality of fuse elements which is programmed with compressed information.

DESCRIPTION OF THE BACKGROUND

In the field of semiconductor memory devices (referred to as "memories" hereinafter), such as dynamic random access memories (DRAMs), demands for increased storage capacity are growing. For large-scale memories (memories having a large capacity), it is desirable to have a redundancy function to replace a defective cell which has occurred in a memory cell array with a redundancy cell to implement manufacturing yield improvement. An address corresponding to the defective cell is programmed into a redundancy fuse, which is blown by laser light irradiation. The address, which is programmed into the fuse, is read at the start time of memory chip operation, and is stored into a fuse latch. The address stored in the fuse latch is compared with a memory-cell access address input from an external source. If the two addresses match, the redundancy cell instead of the defective cell is accessed, whereby compensation for the defective cell is performed.

Ordinarily, if a defective cell exists, substitution of redundancy cells is performed in units on the basis of either one row or one column in a memory cell array of memory cells containing the defective cell. In the case of row-basis substitution, that is, in the case of row redundancy, a row address is programmed into fuses. In the case of column-basis substitution, that is, in the case of column redundancy, a column address is programmed into fuses.

Jpn. Pat. Appln. KOKAI Publication No. 11-86588 describes an algorithm to share fuses among redundancy elements to save the number of address fuses used to substitute redundancy elements for a defective element.

In addition, Jpn. Pat. Appln. KOKAI Publication No. 2000-207896 discloses a technique capable of repairing an error that occurs in burn-in testing of a semiconductor device packaged after laser repair in a wafer stage.

Further, U.S. Pat. No. 6,418,069 discloses a technique wherein a row line or column line containing a defective cell is replaced with one of redundant lines by programming. If an additional defective cell is detected after a predetermined number of redundant lines have been programmed, the programming of at least one of the redundant lines is canceled, and the redundant line is programmed for repairing another memory cell defect.

SUMMARY OF THE INVENTION

One aspect of the present invention is to provide a semiconductor device that includes a plurality of first fuse-sets which store first information, wherein each of the first fuse-sets includes at least one first fuse element and the first information has been compressed, a second fuse-set including at least one second fuse element which stores data modification information used to modify the first information and an information creation circuit which modifies the first information based on the data modification information, expands the modified first information and thereby creates second information.

Another aspect of the present invention is to provide a memory cell array having a plurality of memory cells, a spare memory cell array having a plurality of spare cells used to compensate for a defective cell existing in the memory cell array, a plurality of first fuse-sets which store first redundancy information used to replace the defective cell existing in the memory cell array by the spare cell in the spare memory cell array, wherein each of the first fuse-sets includes at least one first fuse element and the first redundancy information has been compressed, a second fuse-set including at least one second fuse element which stores data modification information used to modify the first redundancy information and an information creation circuit which modifies the first redundancy information based on the data modification information, expands the modified first redundancy information and thereby creates second redundancy information.

DETAILED DESCRIPTION OF THE INVENTION

Figure 17:
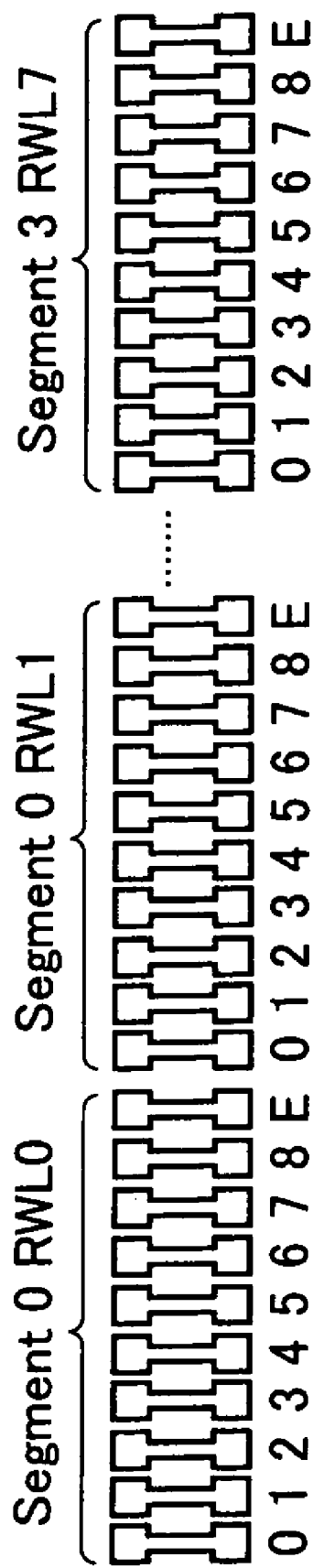
FIG. 17 is a view showing exemplary redundancy fuses provided in a DRAM having row redundancy.

FIG. 17 shows exemplary redundancy fuses provided in a DRAM having row redundancy. In this case, a memory cell array is configured in four segments, namely, segments 0 to 3. Eight redundancy word lines for compensation for defective cells are disposed in the respective segments. Eight fuse-sets corresponding to the eight redundancy word lines (RWL0 to RWL7) are provided in the respective segments. Each Fuse-set includes one enable fuse and nine address fuses. The enable fuse is used to program whether or not the fuse-set will be used, and the nine address fuses are used to designate an address that uses the redundancy. In this case, the number of normal word lines per segment is assumed to be 512.

Figure 18:
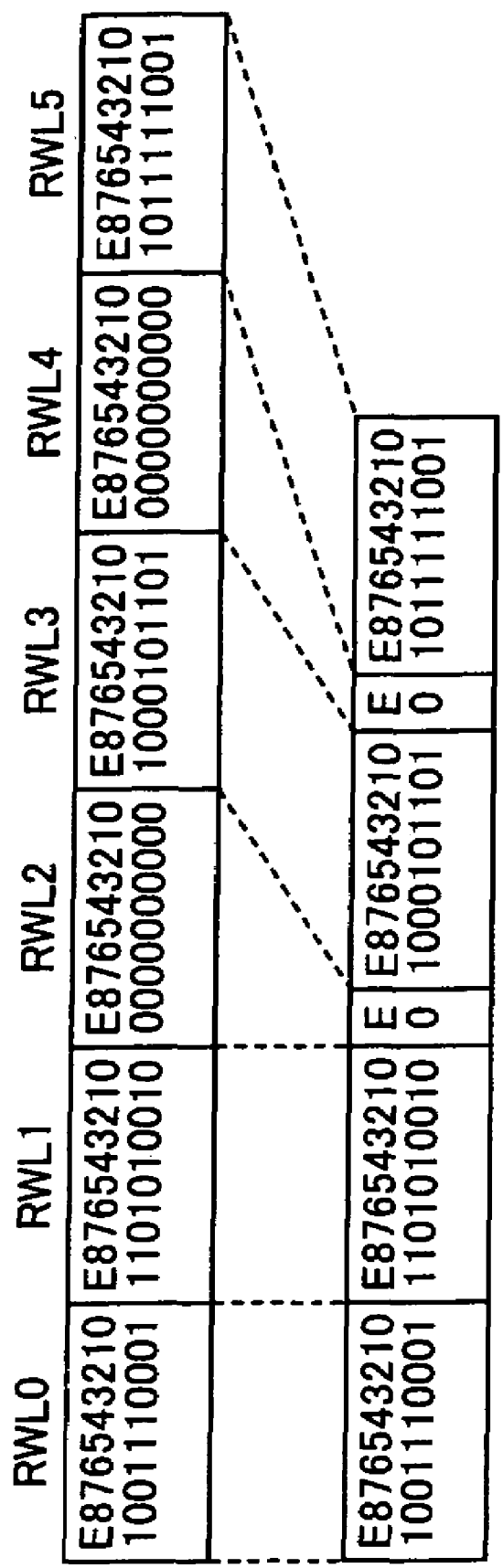
FIG. 18 is a view explaining conventional fuse blowing.

Since such fuse elements use a large occupation area on the chip, there is a demand for reducing the number of the fuse elements. A scheme used to reduce the number of fuses is a fuse data compression scheme. An example of a conventional data compression scheme is shown in FIG. 18. With reference to FIG. 18, shown on the upper side is data before being compressed and shown on the lower side is data after having being compressed. In this example, data (ten data "0s") of fuse-sets 2 (RWL2), and 4 (RWL4) including an unblown enable fuse (E), are represented by a "0". Consequently, the number of required fuses is reduced from 60 before compression to 42. Generally, a redundancy usage rate per post-production memory chip is about less than half, so that the number of fuses can be reduced to about 70% in accordance with the above-described scheme.

However, in the above-described fuse data compression scheme, the defective cell is unable to be compensated when error occurs in the programming operation of the fuse element. For example, when an error occurs in the programming operation of the address fuse, the redundancy word line is replaced with a word line other than the word line containing the defective cell. That is, the defective cell cannot be compensated when error occurs in the programming operation of the address fuse.

Figure 19:
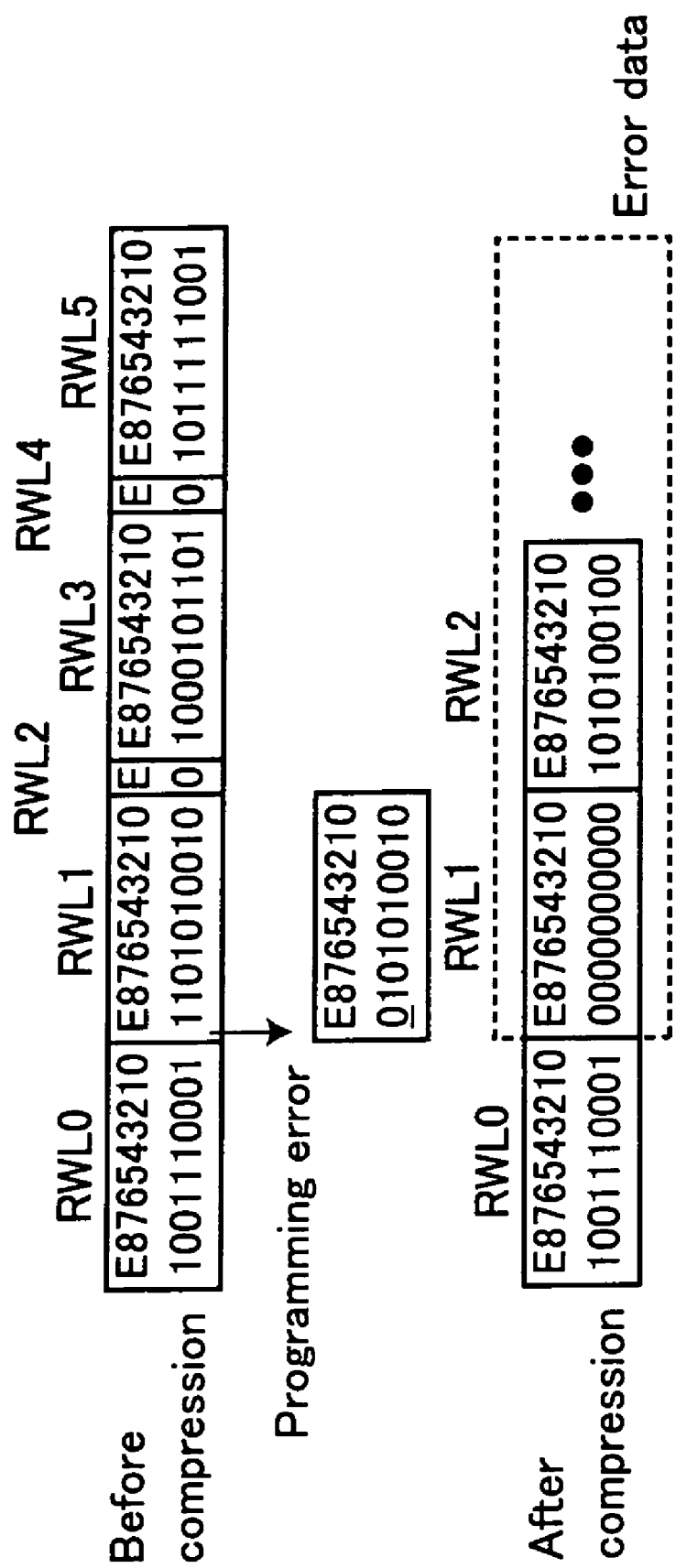
FIG. 19 is a view showing an example of redundancy information in a case where the data "0" is accidentally programmed by programming error in the conventional data compression.
Figure 20:
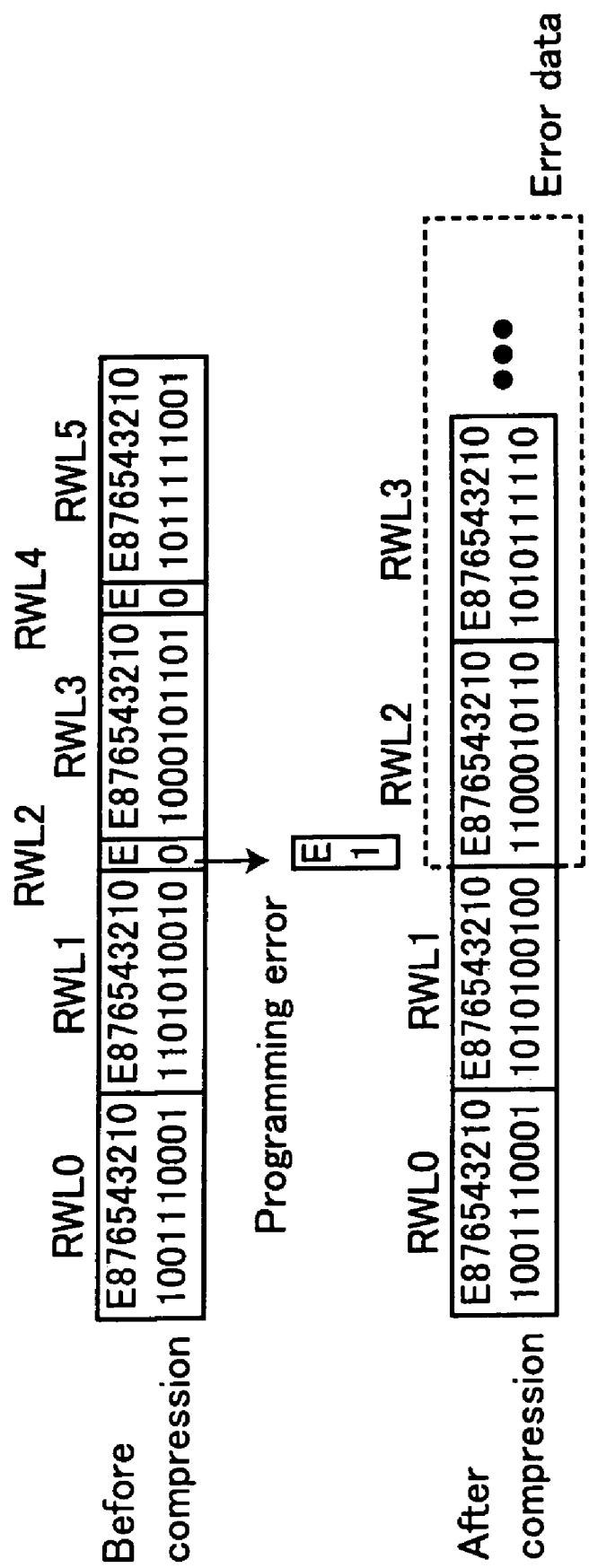
FIG. 20 is a view showing an example of redundancy information in a case where the data "1" is accidentally programmed by programming error using conventional data compression.

Moreover, also when an error occurs in the programming operation of the enable fuse (E), the defective cell is unable to be compensated. The case where an error occurs in the programming operation of the enable fuse (E) will be described with reference to FIGS. 19 and 20. FIGS. 19 and 20 show a case where data shown on the upper side in FIG. 18 is compressed.

FIG. 19 shows a case where an enable fuse (E) of a fuse-set 1 (RWL1) remains unblown because of programming error. With reference to FIG. 19, shown on the upper side is data before being compressed and shown on the lower side is data after having being compressed.

If the top, i.e., enable bit, of data transferred from the fuse-set 1 is "0", a first bit and nine bits subsequent thereto are retrieved as data of the fuse-set 1. However, in FIG. 19, the enable fuse (E) of the fuse-set 1 is not blown but data "0" is programmed into the enable fuse (E). Therefore, it is considered that data of the fuse-set 1 has been compressed and the enable bit of the fuse-set 1 is expanded to ten data "0s". In this case, it is considered that a next fuse to the enable fuse (E) of the fuse-set 1 is an enable fuse (E) of a fuse-set 2 (RWL2). That is, data "1" programmed into the next fuse and nine bits subsequent thereto are retrieved as data of the fuse-set 2. Thus, the programming error in the enable bit of RWL1, propagates to the other fuse sets, causing a catastrophic error.

FIG. 20 shows a case where an enable fuse (E) of a fuse-set 1 (RWL1) is accidentally blown because of a programming error. With reference to FIG. 20, shown on the upper side is data before being compressed and shown on the lower side is data after having being compressed.

If the top, i.e., enable bit, of data transferred from the fuse-set 2 is "0", ten data "0s" are retrieved as data of the fuse-set 2. However, in FIG. 20, the enable fuse (E) of the fuse-set 2 is blown but data "1" is programmed into the enable fuse (E). Therefore, it is considered that data of the fuse-set 1 has not been compressed and the enable bit of the fuse-set 2 and nine bits subsequent thereto are retrieved as data of the fuse-set 2. Likewise, as was the case with FIG. 19, when the enable bit is accidently inverted, the error propagates, thus tainting each of the other fuse sets.

As shown in FIGS. 19 and 20, when an error occurs in a programming operation of an enable fuse (E), the data after having been expanded (the data shown on the lower side in FIGS. 19 and 20) become different from the data before being expanded (the data shown on the upper side in FIG. 18). If the data after having been expanded differs from the data before being expanded, the redundancy word line is replaced with the word line other than the word line containing the defective cell and the defective cell is consequently unable to be compensated. Thus, programming errors that cause incorrect expansion, or non-expansion, are catastrophic in that they cause data interpretation errors in other fuse sets.

First Embodiment

Figure 1:
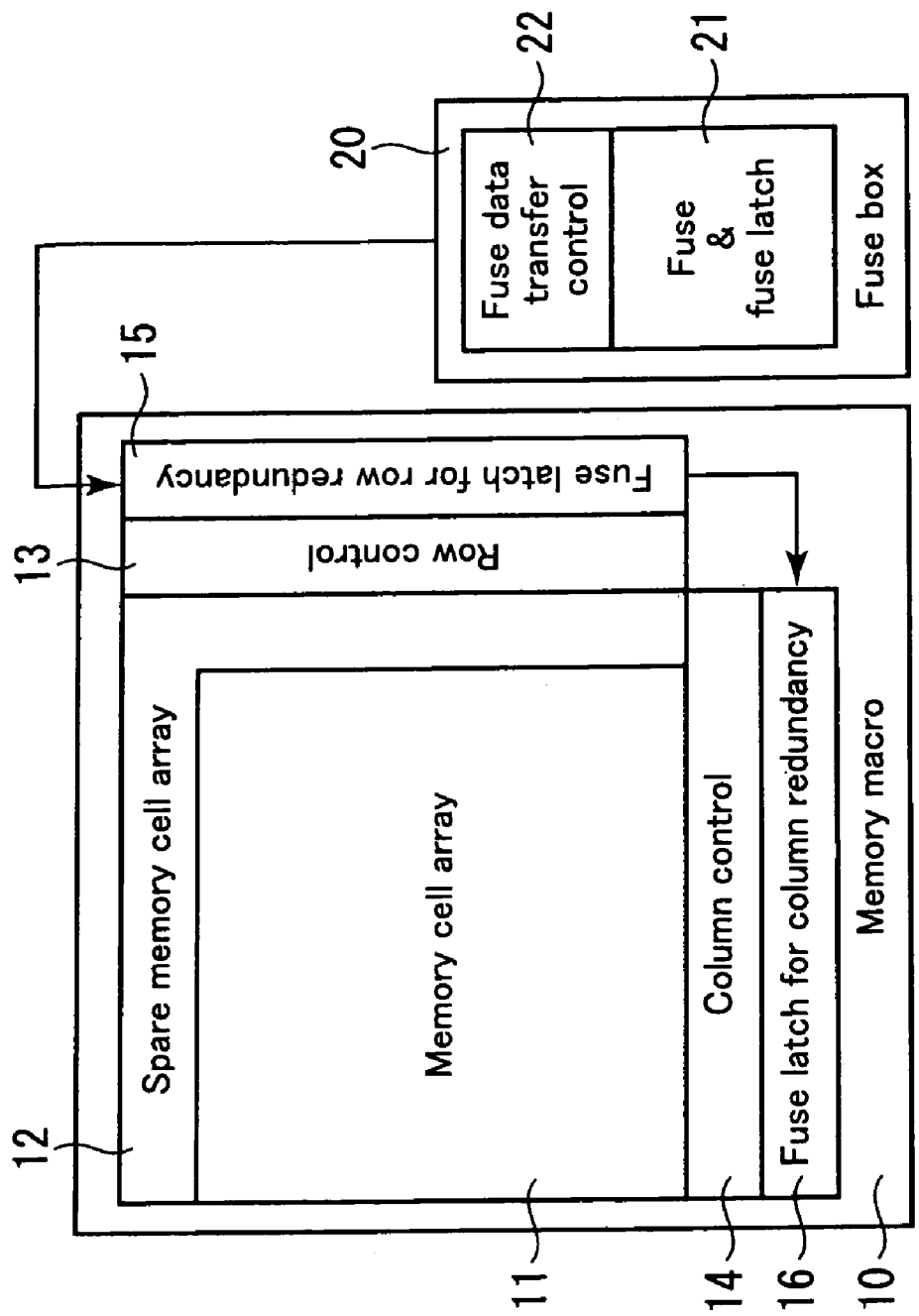
FIG. 1 is a block diagram showing an overall configuration of a memory of a first embodiment of the present invention.

FIG. 1 is a block diagram showing an overall configuration of a memory of a first embodiment. The memory is, broadly, configured of a memory macro 10 and a fuse box 20.

The memory macro 10 includes a memory cell array 11, a spare memory cell array 12, a row control circuit 13, a column control circuit 14, a fuse latch 15 for row redundancy, and a fuse latch 16 for column redundancy.

A plurality of memory cells is disposed in a matrix in the memory cell array 11. A plurality of memory cells disposed in a same row is commonly connected to a corresponding one of a plurality of word lines. A plurality of memory cells disposed in a same column is commonly connected to a corresponding one of a plurality of bit lines.

A plurality of redundancy word lines and a plurality of redundancy bit lines are provided in the spare memory cell array 12. When a defective cell exists in the memory cell array 11, a plurality of spare cells used for substitution to compensate for the defective cell are connected to the individual redundancy word line and bit line.

The row control circuit 13 performs selection of either a word line in the memory cell array 11 or a redundancy word line in the spare memory cell array 12 when accessing memory cells of the memory cell array 11. The selection is performed in accordance with redundancy information containing a supplied row address (selection information) and a redundancy row address stored in the row-redundancy fuse latch 15.

The column control circuit 14 performs selection of either a bit line in the memory cell array 11 or a redundancy bit line in the spare memory cell array 12 when accessing memory cells of the memory cell array 11. The selection is performed in accordance with redundancy information containing a supplied column address (selection information) and a redundancy column address stored in the column-redundancy fuse latch 16.

When a defective cell exists in the memory cells of the memory cell array 11, the row-redundancy fuse latch 15 stores redundancy information containing a redundancy row address used to substitute one row of spare cells of the spare memory cell array 12 for one row of memory cells of the memory cell array 11 that contain the defective cell.

When a defective cell exists in the memory cells of the memory cell array 11, the column-redundancy fuse latch 16 stores redundancy information containing a redundancy column address used to substitute one column of spare cells of the spare memory cell array 12 for one column of memory cells of the memory cell array 11 that contain the defective cell.

Access is made to a memory cell or spare cell positioned at the intersection of the word line or redundancy word line selected by the row control 13 and the bit line or redundancy bit line selected by the column control 14. In the event of data writing, data to be written are supplied to the selected memory cell through a data input/output circuit (I/O) and a sense amplifier, whereby the data writing is performed thereinto. In the event of data reading, data stored in the selected memory cell is read by the sense amplifier and is output to the outside of the memory through the data I/O.

The fuse box 20 creates redundancy information for being stored into the row-redundancy fuse latch 15 and the column-redundancy fuse latch 16. The fuse box 20 is configured of a fuse and fuse latch 21 and a fuse data transfer control 22. The fuse and fuse latch 21 includes a plurality of fuse elements programmed with redundancy information containing, for example, a redundancy address. The fuse data transfer control circuit 22 is supplied with the redundancy information programmed into the fuse and fuse latch 21. Then the fuse data transfer control circuit 22 expands the redundancy information to thereby create new redundancy information, and transfers the created redundancy information to the row-redundancy fuse latch 15 and column-redundancy fuse latch 16 in the memory macro 10.

Figure 2:
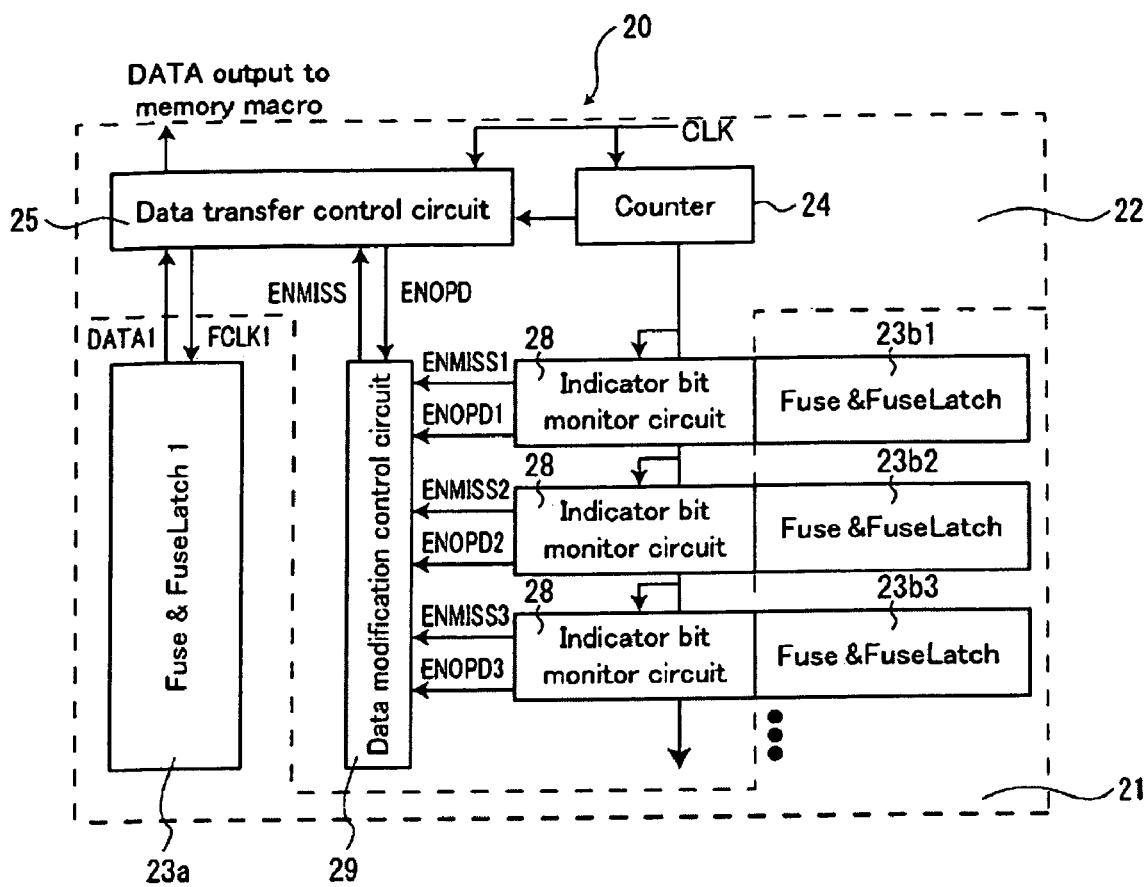
FIG. 2 is a block diagram showing a practical configuration of a fuse box portion of FIG. 1.

FIG. 2 is a block diagram showing a practical configuration of the fuse box 20 of FIG. 1. A plurality of fuse and fuse latches, which work as redundancy information storage circuits, are provided in the fuse and fuse latch 21. The present embodiment shows an exemplary case where as the above-described plurality of fuse and fuse latches, first fuse and fuse latch 23*a* and a plurality of second fuse and fuse latches 23*bi* (23*b*1, 23*b*2, 23*b*3, . . . ) are provided.

In the respective first, and second fuses, and fuse latches 23*a*, 23*bi*, a plurality of fuse elements are provided as nonvolatile storage elements, and a plurality of fuse latches are provided corresponding to the individual fuse elements, whereby data programmed into the individual fuse elements are latched. In synchronization with a transfer clock signals FCLK1 being supplied, the first fuse and fuse latch 23*a* supplies data as serial data DATA1, which have been latched in the plurality of fuse latches, to the fuse data transfer control circuit 22.

Redundancy information used to replace the defective cell existing in the memory cell array 11 by the spare cell in the spare memory cell array 12 is programmed into the first fuse and fuse latch 23*a*. The redundancy information programmed into the first fuse and fuse latch 23*a* has been compressed. In the respective second fuse and fuse latches 23*bi*, data modification information used to modify the enable bit (E) programmed into the first fuse and fuse latch 23*a* is programmed.

The fuse data transfer control circuit 22 serving as a redundancy information creation circuit is configured of, for example, a counter 24, a data transfer control circuit 25, a plurality of indicator bit monitor circuits 28 and a plurality of data modification control circuits 29. The indicator bit monitor circuits 28 and the data modification control circuits 29 are provided corresponding to the second fuse and fuse latches 23*bi*.

The counter 24 counts clock signals CLK being supplied. A count output of the counter 24 is supplied to the respective indicator bit monitor circuits 28. Each of the indicator bit monitor circuits 28 detects a value of an indicator bit in data programmed into a corresponding one of the second fuse and fuse latches 23*bi*. Furthermore, when the enable bit (B) in the data programmed into the one of the second fuse and fuse latches 23*bi* is programmed with data "1", the indicator bit monitor circuits 28 compare the indicator bit with the count output of the counter 24. As a consequence, if a match is found in the comparison, the indicator bit monitor circuits 28 supplies a data modification signal EMNISSi, ENOPDi (EMNISS1, EMNISS2, EMNISS3, . . . ENOPD1, ENOPD2, ENOPD3, . . . ) to the data modification control circuit 29. The data modification signal EMNISSi is used for indicating to the data modification control circuit 29 whether or not the enable bit (E) will be modified. The data modification signal ENOPDi is used for indicating data with which the enable bit (E) to be modified is replaced. Upon reception of the data modification signal, the data modification control circuit 29 supplies a data modification signal EMNISS, ENOPD to the data transfer control circuit 25. The data transfer control circuit 25 modifies the enable bit (E) in the data programmed into the first fuse and fuse latch 23*a* based on the data modification signal EMNISS, ENOPD, expands the redundancy information based on the modified enable bit (E) and thereby creates new redundancy information. The new redundancy information is transmitted to the memory macro 10.

Figure 3:
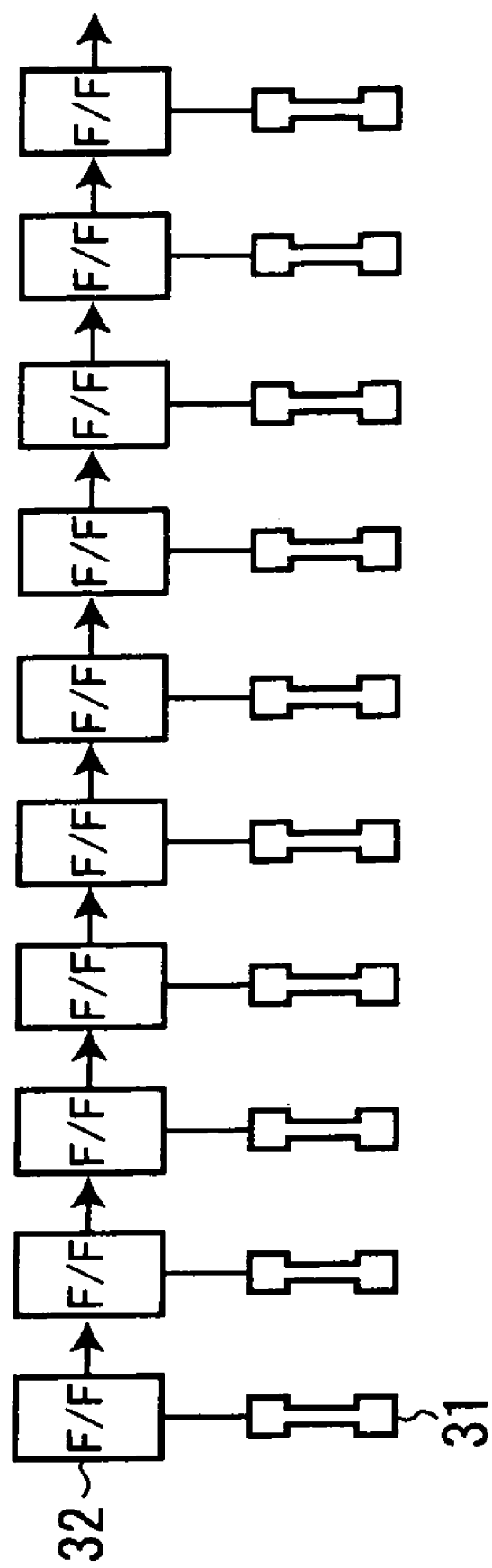
FIG. 3 is a circuit diagram showing a practical configuration of a first, and second fuse, and a fuse latch of FIG. 2.

FIG. 3 is a detailed circuit diagram showing a practical configuration of the first fuse and fuse latch (redundancy information storage circuits) 23*a* of FIG. 2. A plurality of fuse elements 31 are each a programmable nonvolatile storage element, and redundancy information containing, for example, a redundancy address is programmed into the plurality of fuse elements. A plurality of fuse latches 32 each including a flip-flop (F/F) is connected to the individual fuse elements 31. The plurality of fuse latches 32 are connected in series.

Redundancy information programmed into the individual fuse elements 31 are latched by corresponding fuse latches 32. Redundancy information latched by the plurality of fuse latches 32 are serially transferred in synchronization with the transfer clock signal FCLK1 and supplied as the serial data DATA1 to the data transfer control circuit 25.

Each of the second fuse and fuse latches 23bi (data modification information storage circuits) includes a plurality of fuse elements programmed with the redundancy information and a plurality of fuse latches provided corresponding to the individual fuse elements. The plurality of fuse latches are connected in series. Thus, each of the second fuse and fuse latches 23bi has the same composition as the first fuse and fuse latch 23a. However, each of the second fuse and fuse latches 23bi does not have an input terminal of the transfer clock signal compared with the first fuse and fuse latch 23a, and the data modification information programmed into the fuse latches are not transmitted. The data modification information latched by the plurality of fuse latches is monitored by the indicator bit monitor circuits 28 corresponding to the second fuse and fuse latches 23bi.

Figure 4:
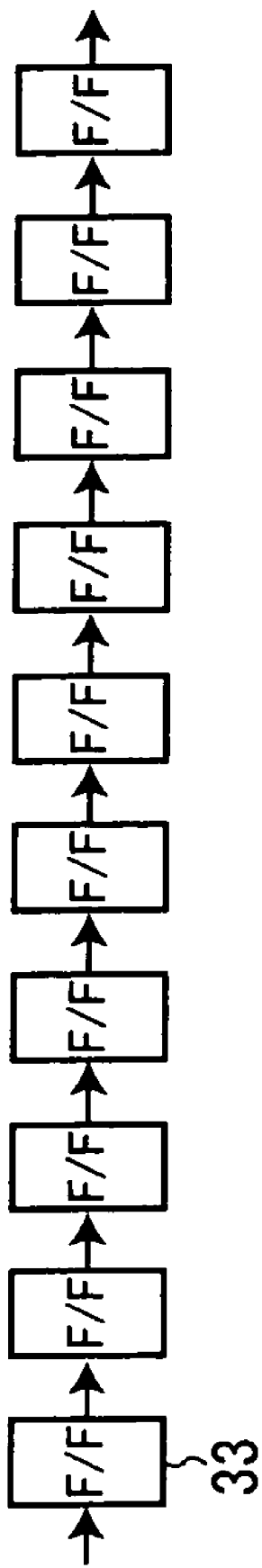
FIG. 4 is a circuit diagram showing a practical configuration of a fuse latch for row redundancy, or a fuse latch for column redundancy of FIG. 1.

FIG. 4 is a circuit diagram showing a practical configuration of the row-redundancy and column-redundancy fuse latches 15, 16 of FIG. 1. In the respective fuse latches 15, 16, a plurality of series connected fuse latches 33 each including a flip-flop (F/F) are provided. New data created in the fuse data transfer control circuit 22 is serially supplied to an end portion of the plurality of fuse latches 33, and is then serially transferred through the plurality of fuse latches 33. Thereby, redundancy information containing, for example, a redundancy address is set to the fuse latches 15, 16.

Figure 5:
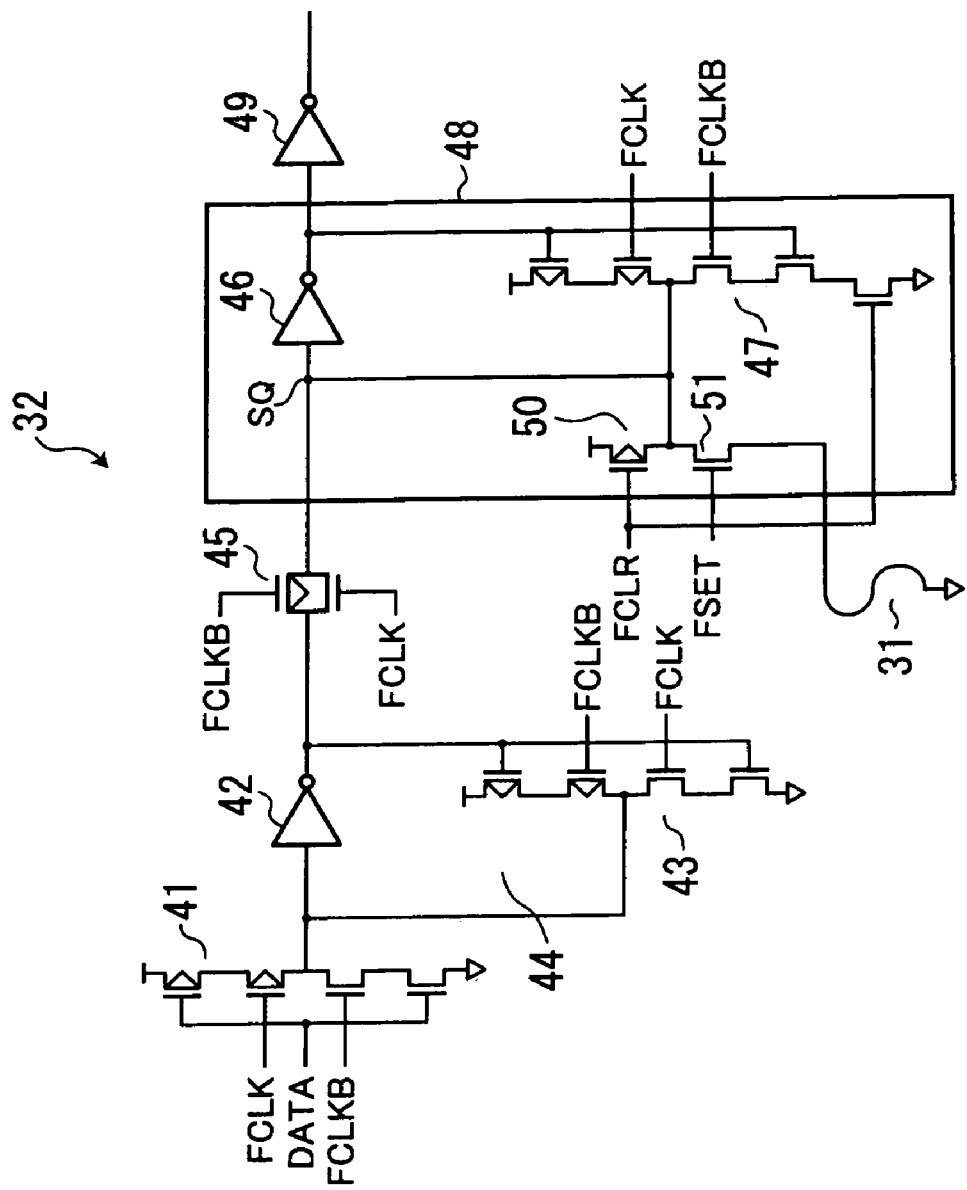
FIG. 5 is a circuit diagram showing a practical configuration of a fuse latch to which one fuse element of FIG. 3 is connected

FIG. 5 is a circuit diagram showing a practical configuration of the fuse latch 32 to which one of the fuse elements 31 of FIG. 3 is connected. The fuse latches 32 are configured to include a clocked inverter circuit 41 that is supplied with data DATA transferred from a preceding fuse latch 32; a latch 44 that is configured of an inverter circuit 42 and a clocked inverter circuit 43 and that latches an output of the clocked inverter circuit 41; a CMOS transfer gate 45 that transfers and controls an output of the latch 44; a latch 48 that includes an inverter circuit 46 and a clocked inverter circuit 47, wherein data programmed into the fuse elements 31 is set and data are supplied from the preceding CMOS transfer gate 45; and an inverter circuit 49 that is supplied with an output of the latch 48.

In the latch 48 there are further provided a PMOS transistor 50 to clear an input node SQ of the latch 48, and an NMOS transistor 51 which sets data programmed into the fuse elements 31 to an input node SQ.

The clocked inverter circuits 41 and 47 are each controlled by a clock signal FCLK (FCLK1) and an inverse clock signal FCLKB, and the CMOS transfer gate 45 is controlled by the inverse clock signal FCLKB and the clock signal FCLK.

Figure 6:
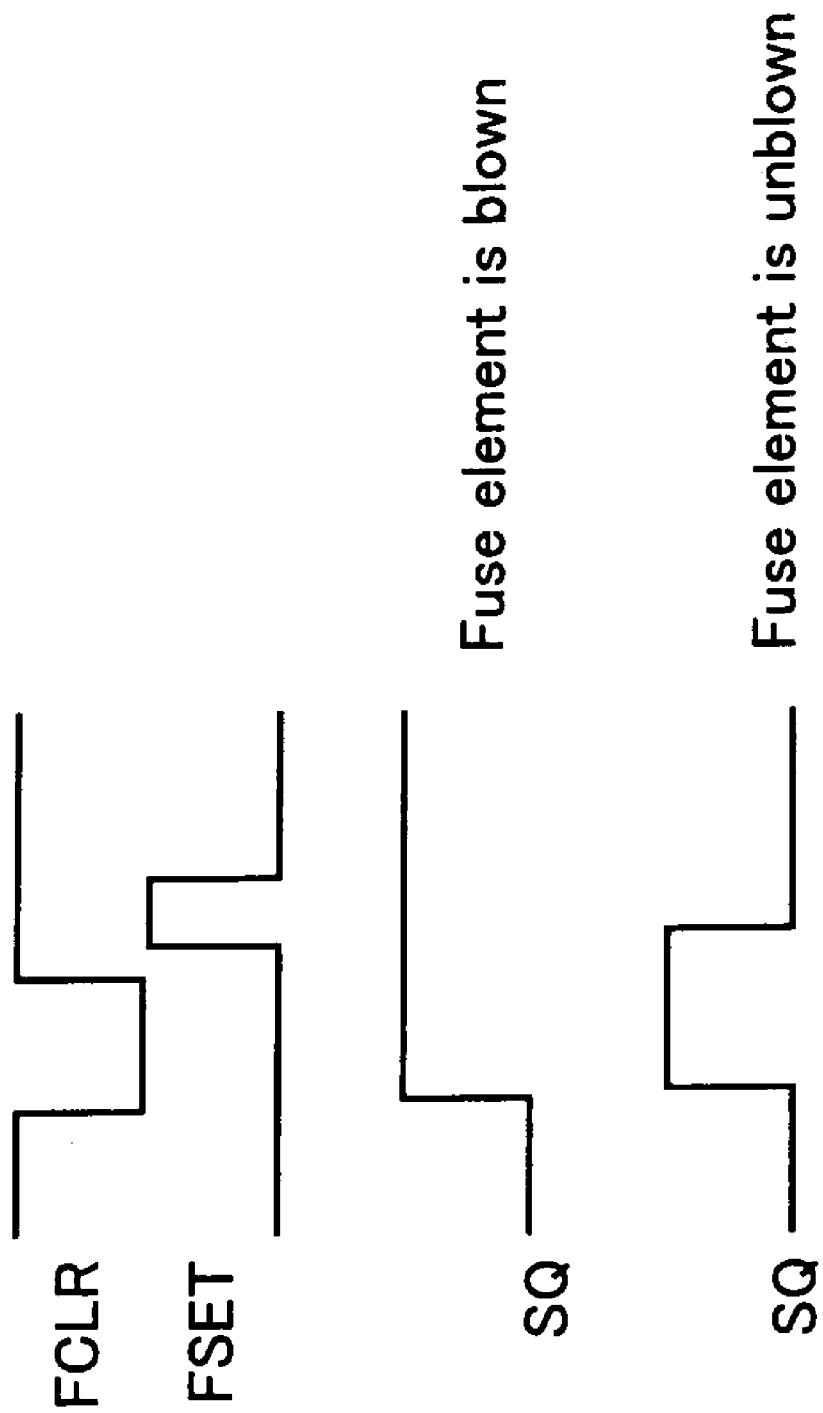
FIG. 6 is a timing chart showing exemplary operation of the fuse latch of FIG. 5.

As shown in a timing chart of FIG. 6, in the event of transfer of the data programmed into the fuse elements 31 to the fuse latch 32, a clear signal FCLR and a set signal FSET are input. When the clear signal FCLR becomes the "L" level, the transistor 50 turns on and the input node SQ of the latch 48 is forcedly cleared to the "H" level. Thereafter, when the set signal FSET becomes the "H" level, the transistor 51 turns on. In this state, if the fuse element 31 is blown, then the input node SQ remains at "H". On the other hand, if the fuse element 31 is not blown, then the input node SQ goes "L" level. Thereafter, the clock signal FCLK and the inverse clock signal FCLKB are supplied as transfer signals, data is serially transferred toward the backstage via the plurality of fuse latches 32.

Figure 7:
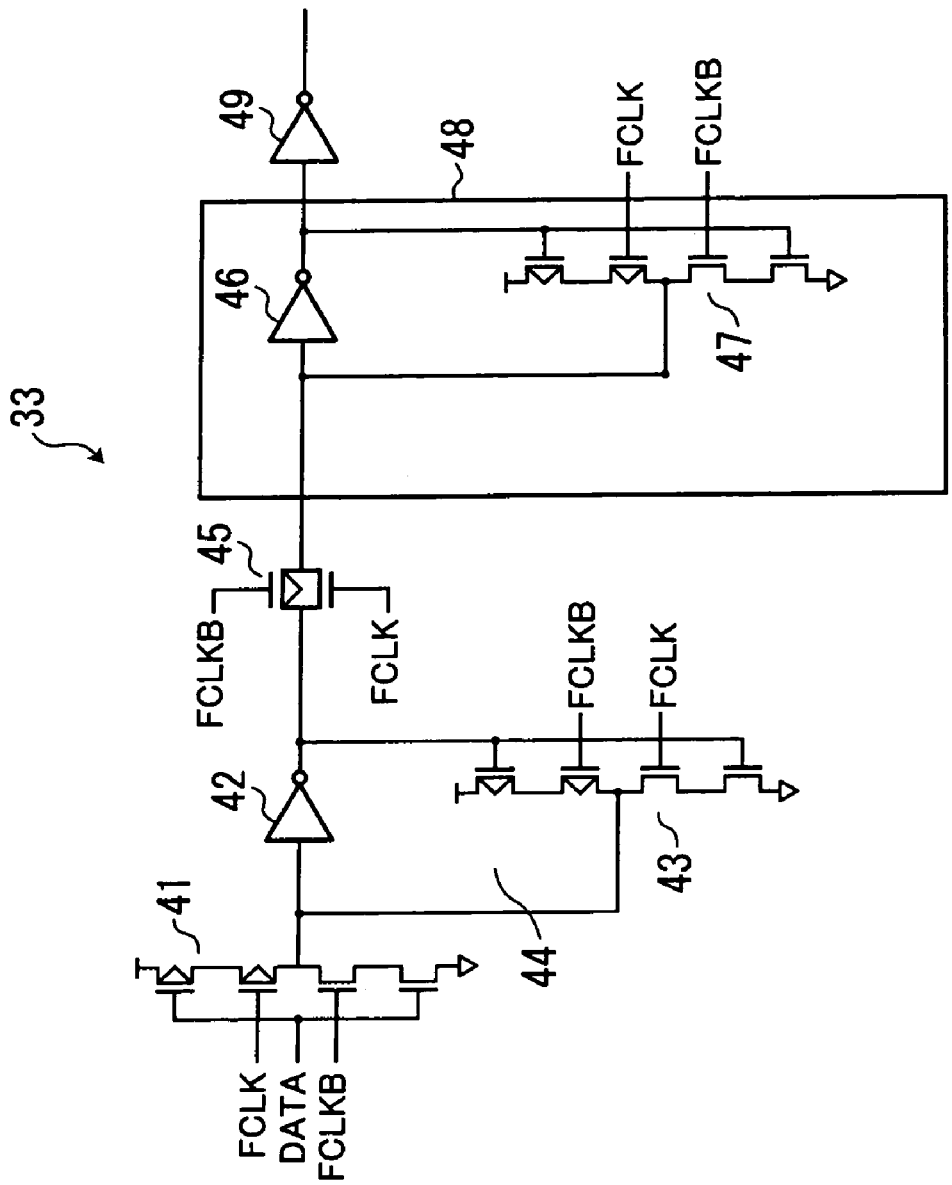
FIG. 7 is a circuit diagram showing a practical configuration of a fuse latch circuit shown in FIG. 4.

FIG. 7 is a circuit diagram showing a practical configuration of one of the fuse latches 33 of FIG. 4. In comparison to the fuse latch 32 shown in FIG. 5, the fuse latch 33 is only different in that the two transistors 50 and 51 in the latch 48 are omitted, but the same as the fuse latch 32 for other configuration portions, so that description of the configuration thereof will not be repeated.

In the fuse latch 33 shown in FIG. 7, the clock signal FCLK and the inverse clock signal FCLKB are supplied as transfer clock signals, thereby data are transferred in the plurality of fuse latches 33 connected in series.

Figure 8:
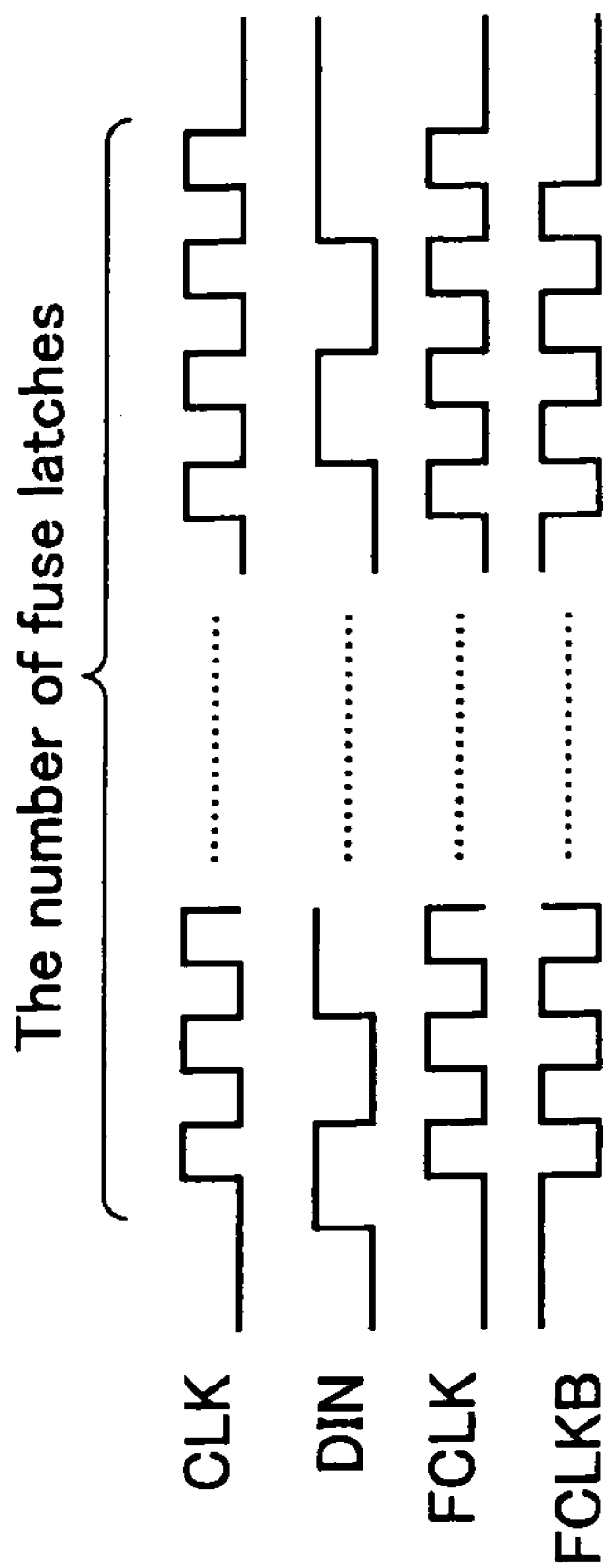
FIG. 8 is a timing chart showing exemplary operation of the fuse latch of FIG. 7.

FIG. 8 is a timing chart formed during data transfer in the fuse latches 15, 16 where the plurality of fuse latches 33 of the type shown in FIG. 7 are provided. In FIG. 8, DIN denotes data for being transferred. The clock signal FCLK and the inverse clock signal FCLKB are activated multiple times corresponding to the number of fuse latches 33 provided in the fuse latches 15, 16. The clock signal FCLK and the inverse clock signal FCLKB are generated in the manner that clock signals CLK are counted by a counter (not shown). Thereby, redundancy information created in the data transfer control circuit 25 are transferred to and set at predetermined locations of the plurality of fuse latches 33 provided in the fuse latches 15, 16.

Operation of the memory having the above-described configuration will now be described here. For facilitating understanding, description will be made with reference to an exemplary case where, when a defective cell has occurred in the memory cell array 11, the defective cell is replaced by a spare cell in the spare memory cell array 12 through substitution performed in units of one row.

First, the first testing is performed. The testing is performed in the wafer state, for example. In this event, if a defective cell is found in the memory cell array 11, then redundancy information including an address of a word line containing the defective cell is programmed into the first fuse and fuse latch 23a of FIG. 2. The programming is performed in the manner that the fuse element is cut (blown) by using laser light irradiated from a laser radiation device. In this event, the second-fuse and fuse latch 23b of FIG. 2 is not programmed.

Figure 9:
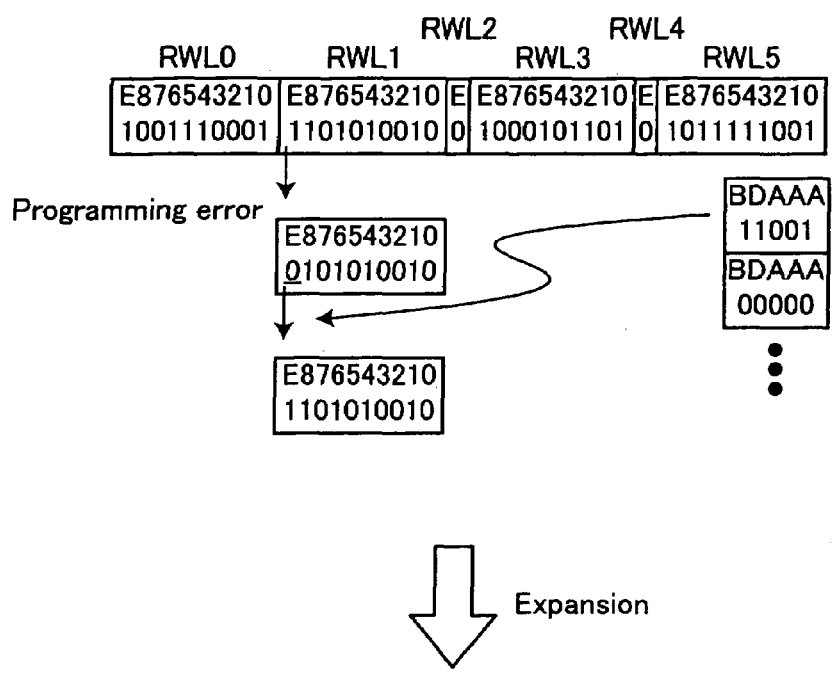
FIG. 9 includes two views, FIG. 9a and FIG. 9b, showing a manner in which an enable bit is rewritten to data "1" by a data transfer control circuit of the memory of the first embodiment.

The redundancy information to be programmed into the first fuse and fuse latch 23a is compressed by a compression scheme as the type described by reference to FIG. 18. The first fuse and fuse latch 23a includes a plurality of fuse-sets (first fuse-sets). The plurality of first fuse-sets are respectively provided corresponding to the redundancy word lines used to replace the word line containing the defective cell. For example, as shown in FIG. 9a, when using redundancy word lines 0, 1, 3, and 5 (=0th, 1st, 3rd, and 5th word lines) in six redundancy word lines, data "1" (=binary or logical 1) is programmed into the enable fuse (E) of ten fuses of each of fuse-sets 0, 1, 3, and 5 (=0th, 1st, 3rd, and 5th fuse-sets), and an address for designating an address using the row redundancy is programmed into the remaining nine address fuses of the respective fuse-set. FIG. 9a shows the case where the enable fuse (E) of the fuse-set 1 (RWL1) remains unblown because of programming error. For unused fuse-sets 2 and 4 (=2nd and 4th fuse-sets), similarly as in the case described by reference to FIG. 18, data composed of ten "0s" are compressed into data composed of a single "0", and "0" is programmed into the respective single enable fuse (E). That is, the enable fuse (E) indicates that the data programmed into the corresponding fuse-set has not been compressed when data "1" is programmed into the enable fuse (E), and the enable fuse (E) indicates that the data programmed into the corresponding fuse-set has been compressed when data "0" is programmed into the enable fuse (E).

Next, the second test is performed in order to confirm whether or not the defective cell has been properly compensated for by the programming operation of the first fuse and fuse latch 23a. In the second test, it is found that the enable fuse (E) of the fuse-set 1 (RWL1) remains unblown. The data (data modification information) used to modify the enable bit (E) of the fuse-set 1 (RWL1) is programmed into the second fuse and fuse latches 23bi shown in FIG. 2. The programming is performed in the manner that the fuse element is cut (blown) by using laser light irradiated from a laser radiation device or by applying a large current flow from a control circuit (not shown). In this event, the first fuse and fuse latch 23a of FIG. 2 is not programmed.

The second fuse and fuse latch 23bi includes a plurality of fuse-sets (second fuse-sets). Each of the plurality of the second fuse-sets is composed of an enable fuse (B), a data fuse (D) and address fuses (A). The enable fuse (B) stores the enable bit (B) indicating whether or not the data modification information has been programmed into the corresponding second fuse-set. The data fuse (D) stores the data bit (D) which is replaced by the enable bit (E) to be modified. The address fuses (A) store the indicator bits (A) indicating that the enable bit (E) programmed into which one of the first fuse-sets is modified.

In this example, in order to rewrite the enable fuse (E) of the fuse-set 1 (RWL1) to the data "1", as shown in FIG. 9A, the data "1" is programmed into the data fuse (D), and the indicator bits (A) which indicates the fuse-set 1 are programmed into the address fuses (A).

After power supply voltage is supplied to the memory chip and before memory access is started, redundancy information written in the first fuse and fuse latches 23a of FIG. 2 is serially read and supplied to the data transfer control circuit 25. Furthermore, when the enable bit (B) is programmed with data "1", the indicator bit monitor circuits 28 compares the indicator bit with the count output of the counter 24. As a consequence, if a match is found in the comparison, the indicator bit monitor circuits 28 supplies a data modification signal EMNISSi, ENOPDi to the data modification control circuits 29. Upon reception of the data modification signal, the data modification control circuit 29 supplies a data modification signal EMNISS, ENOPD to the data transfer control circuit 25. The data transfer control circuit 25 rewrites the enable bit (E) of the fuse-set 1 (RWL1) from data "0" to data "1" based on the data modification signal EMNISS, ENOPD. Then, the data transfer control circuit 25 expands the redundancy information based on the modified enable bit (E) and thereby creates new redundancy information shown in FIG. 9B. The new redundancy information is serially transmitted to the fuse latch 15 for row redundancy and the fuse latch 16 for column redundancy and set in the fuse latch 15 and 16.

Figure 10:
FIG. 10 (FIGS. 10a and 10b) are two views showing a manner in which an enable bit is rewritten to data "0" by a data transfer control circuit of the memory of the first embodiment.
Figure 10:
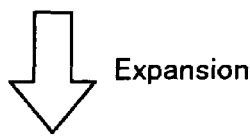

Next, the case where the enable fuse (E) of the fuse-set 2 (RWL2) is accidentally blown because of programming error will be described with reference to FIG. 10. FIG. 10A shows the case where the enable fuse (E) of the fuse-set 2 is programmed with data "1" by programming error.

In this example, in order to rewrite the enable fuse (E) of the fuse-set 2 to the data "0", as shown in FIG. 10A, the data "0" is programmed into the data fuse (D), and the indicator bits (A) which indicates the fuse-set 2 are programmed into the address fuses (A).

When a match is found in the comparison between the count output of the counter 24 and the indicator bit, the indicator bit monitor circuits 28 supplies a data modification signal EMNISSi, ENOPDi to the data modification control circuits 29. Upon reception of the data modification signal, the data modification control circuit 29 supplies a data modification signal EMNISS, ENOPD to the data transfer control circuit 25. The data transfer control circuit 25 rewrites the enable bit (E) of the fuse-set 2 (RWL2) from data "1" to data "0" based on the data modification signal EMNISS, ENOPD. Then, the data transfer control circuit 25 expands the redundancy information based on the modified enable bit (E) and thereby creates new redundancy information shown in FIG. 10B.

Figure 11:
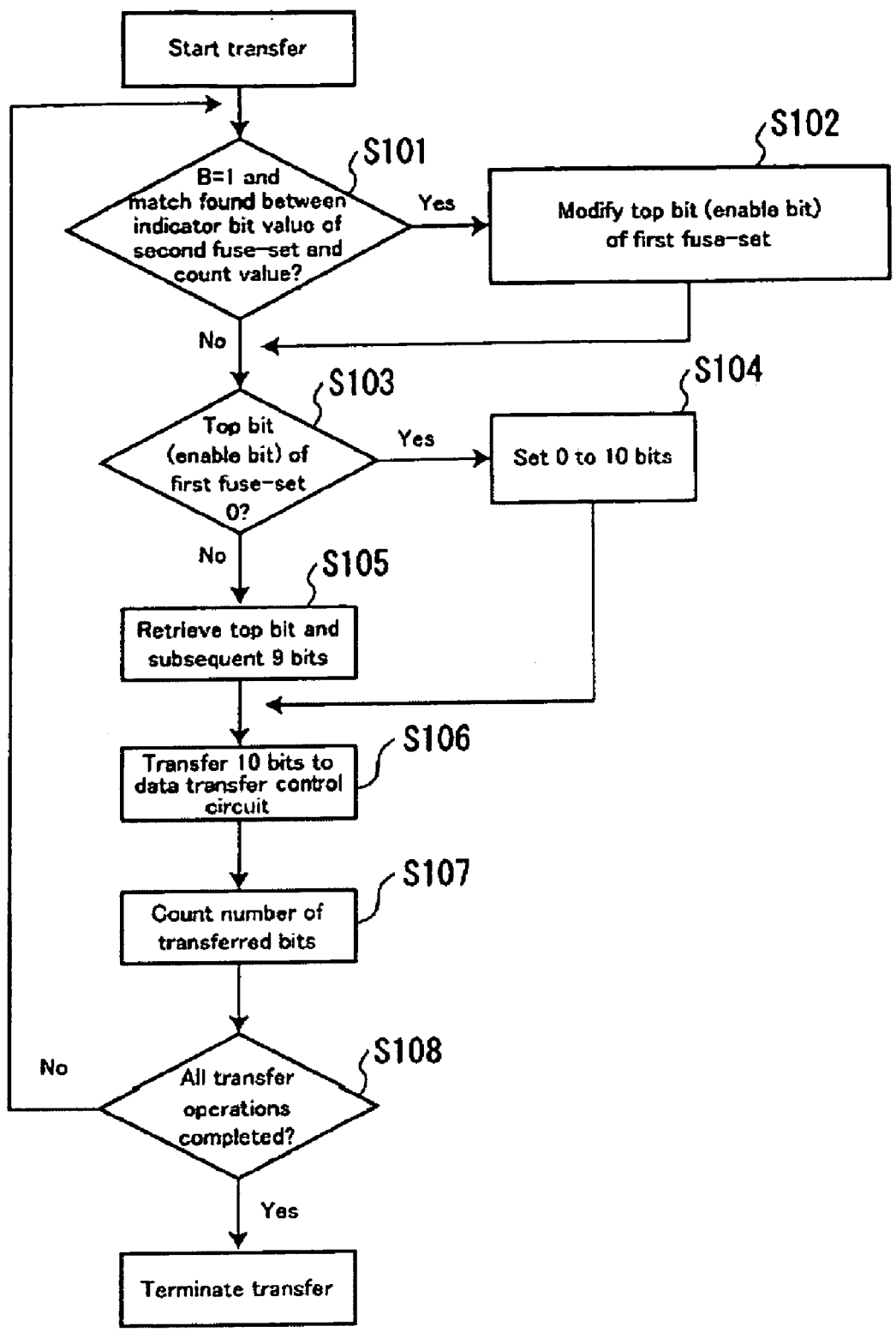
FIG. 11 is a flowchart showing an algorithm used when new redundancy information is created in the data transfer control circuit of the memory of the first embodiment.

FIG. 11 is a flowchart showing an algorithm used when new redundancy information is created in the data transfer control circuit 25. According to the algorithm, synchronously with the start of data transfer, compressed data programmed in the first fuse and fuse latches 23a are expanded and concurrently subjected to modification processing, the enable bits (E) programmed in the first fuse and fuse latches 23a are modified during the transfer, and the data are supplied to the memory macro 10.

First, after start of transfer, comparison is performed between the transfer-clock value and values of indicator bits written in all the second fuse and fuse latches 23bi (Step S101). In other words, in the step S101, the algorithm determines whether or not the enable bit (E) in the first fuse-set subjected to the data transfer will be modified. When a match is found in the comparison between the count output of the counter 24 and the indicator bit, the top, i.e., enable bit (E), of data transferred from the first fuse and fuse latch 23a is modified based on the data bit (D) in the second fuse-set whose the indicator bits (A) matches to the count output of the counter 24 (Step S102).

Next, the algorithm determines whether or not the top, i.e., enable bit (E), of data programmed into the first fuse and fuse latch 23a is data "0" (Step S103). If the enable bit is "0", then data composed of ten "0" bits are generated (Step S104). If the Enable bit is "1", a first bit and nine bits subsequent thereto are retrieved (Step S105). Then the ten bits of data are transferred to the data transfer control circuit 25 (Step S106). Compressed data written in this manner into the first fuse and fuse latch 23a is then expanded. Then, the number of the transferred bits is counted (Step S107), and it is determined whether or not all transfer operations are completed (Step S108). If all the transfer operations are not yet completed, then the algorithm returns to Steps S101. If all the transfer operations are completed, then the transfer to the memory macro 10 terminates.

In the above, the memory of the present embodiment can modify the enable bit (E) in the first fuse-sets based on the data modification information programmed into the second fuse-sets. In other words, the memory of the present embodiment can change the existence of the data compression of the first fuse-sets. Therefore, even if error occurs in the programming operation of the enable fuse (E), the defective cell is able to be compensated.

In the above, the memory of the present embodiment has been described with reference to the case where the defective cell existing in the memory cell array 11 is replaced by a spare cell existing in the spare memory cell array 12 through the substitution performed in units of the row. Alternately, however, such a defective cell can be replaced by a spare cell existing in the spare memory cell array 12 through substitutions performed in units of a column. Still alternately, the two substitution methods can be used in combination.

Second Embodiment

Figure 12:
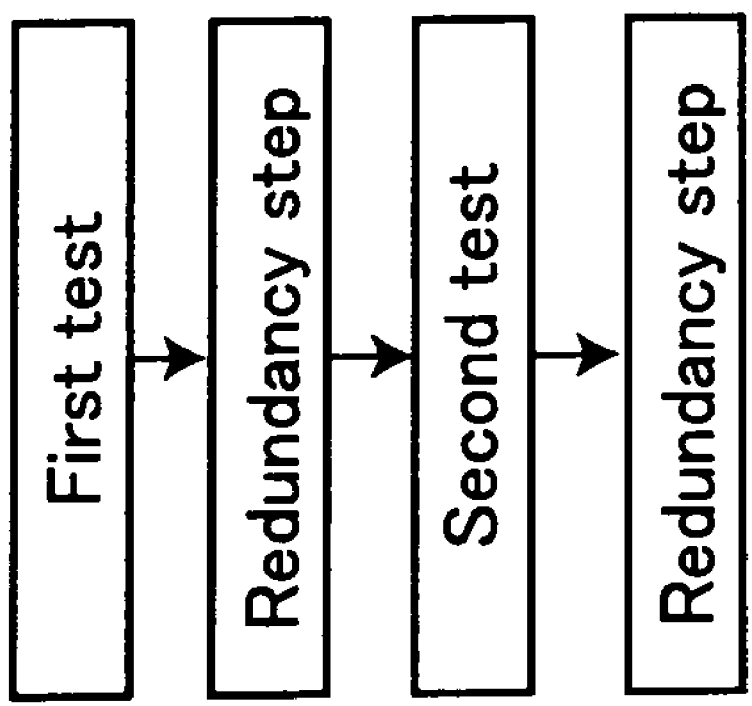
FIG. 12 is a view explaining fuse blowing.

Memory testing includes a variety of processing steps, and the address causing defect is different depending on the processing step. As such, cases occur where it is desired that testing is performed on a chip in, for example, a wafer state, fuse blowing is performed in accordance with the result of the testing, the chip is then packaged, testing is again performed thereon, and fuse blowing is further performed thereon. This case is exemplified in FIG. 12.

However, in the first embodiment, data composed of ten "0s" are compressed into data composed of a single "0", and "0" is programmed into the respective one enable fuse (E). For example, suppose that fuse blowing as shown in FIG. 9A is performed in the first redundancy step. In this case, even when the necessity arises for using the fuse-set 2, 4 in the second redundancy step, since fuse blowing is an irreversible process, the second fuse blowing cannot be performed. As such, it is difficult for the fuse data compression and multiple fuse blowing processes to be compatible with each other. The memory of the present embodiment is configured so that multiple fuse-data programming operations can be performed although the fuse data are compressed.

In the present embodiment, it is assumed that the plurality of fuse elements 31 provided in the first fuse and fuse latch 23a are programmed immediately after testing performed in the wafer state. For this reason, elements having a structure blowable by irradiation of laser light are employed for the fuse elements. However, it is assumed that the plurality of fuse elements 31 provided in the second fuse and fuse latch 23bi are programmed after testing performed after the chip has been packaged. For this reason, elements having a structure blowable by electrical means, such as by applying electric current, are employed for the fuse elements. However, the plurality of fuse elements 31 provided in the second fuse and fuse latch 23bi can be programmed before the chip has been packaged.

Figure 13:
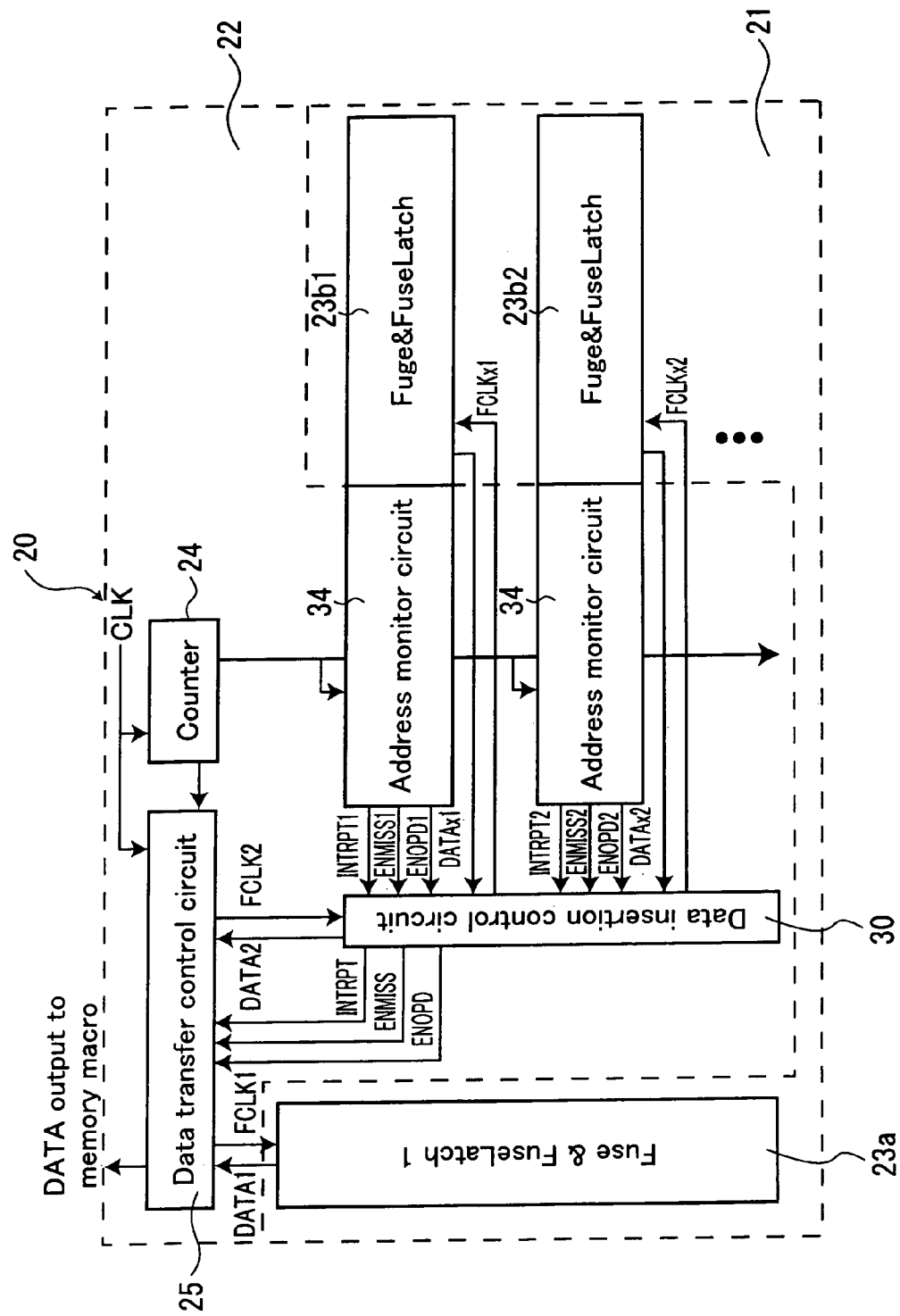
FIG. 13 is a block diagram showing a practical configuration of a fuse box of FIG. 1 of a memory of a second embodiment.

FIG. 13 is a block diagram showing a practical configuration of a fuse box 20 in a memory of the second embodiment. Similarly as in the case shown in FIG. 2, as examples of the plurality of fuse and fuse latches, first and second fuse and fuse latches 23a and 23bi are provided in the fuse and fuse latch 21.

The redundancy information (first redundancy information) is programmed into the first fuse and fuse latch 23a. The first redundancy information programmed has been compressed. The first fuse and fuse latch 23a is programmed in the first redundancy step. In the respective second fuse and fuse latches 23bi, the data modification information used to modify the enable bit (E) programmed into the first fuse and fuse latch 23a is programmed. Furthermore, the respective second fuse and fuse latches 23bi can be programmed with new redundancy information (second redundancy information) in addition to the data modification information used to modify the enable bit (E). The second redundancy information is used to compensate for a defective cell found in the test after the chip has been packaged.

In the fuse data transfer control circuit 22, in addition to the counter 24 and the data transfer control circuit 25, a plurality of address monitor circuits 34 and a data insertion control circuit 30 are provided corresponding to the respective second fuse and fuse latches 23bi.

Similarly as the first embodiment, each of the address monitor circuits 34 detects a value of an indicator bit in data programmed into a corresponding one of the second fuse and fuse latches 23bi. Furthermore, when the enable bit (B) in the data programmed into the corresponding one of the second fuse and fuse latches 23bi is programmed with data "1", the address monitor circuits 34 compare the indicator bit with the count output of the counter 24. As a consequence, if a match is found in the comparison, the address monitor circuits 34 supplies a data modification signal EMNISSi, ENOPDi (EMMISS1, EMNISS2, EMNISS3, . . . ENOPD1, ENOPD2, ENOPD3, . . . ) to the data insertion control circuits 30. Upon reception of the data modification signal, the data insertion control circuits 30 supply a data modification signal EMNISS, ENOPD to the data transfer control circuit 25. The data transfer control circuit 25 modifies the enable bit (E) in the data programmed into the first fuse and fuse latch 23a based on the data modification signal EMNISS, ENOPD.

Furthermore, when the enable bit (E) in the data programmed into the corresponding one of the second fuse and fuse latches 23bi is programmed with data "1", the address monitor circuits 34 compare the indicator bit with the count output of the counter 24. As a consequence, if a match is found in the comparison, the respective address monitor circuits 34 supply an interrupt signal INTRPTi (INTRPT1, INTRPT2, . . . ) to the data insertion control circuit 29. Upon reception of the match signal, the data insertion control circuit 29 supplies a clock signal FCLKxi (FCLKx1, FCLKx2, FCLKx3, . . . ) to a second fuse and fuse latch corresponding to the match between the value of the counter 24 and the indicator-bit value, retrieves ten-bits data DATAxi (DATAxI, DATAx2, DATAx3, . . . ) from the second fuse and fuse latch, and supplies the data to the data transfer control circuit 25. Then the fuse data transfer control circuit 22 combines the ten-bits data DATAxi retrieved from the second fuse and fuse latch with the redundancy information retrieved from the first fuse and fuse latch to thereby create new redundancy information. The new redundancy information is transmitted to the memory macro 10.

Figure 14:
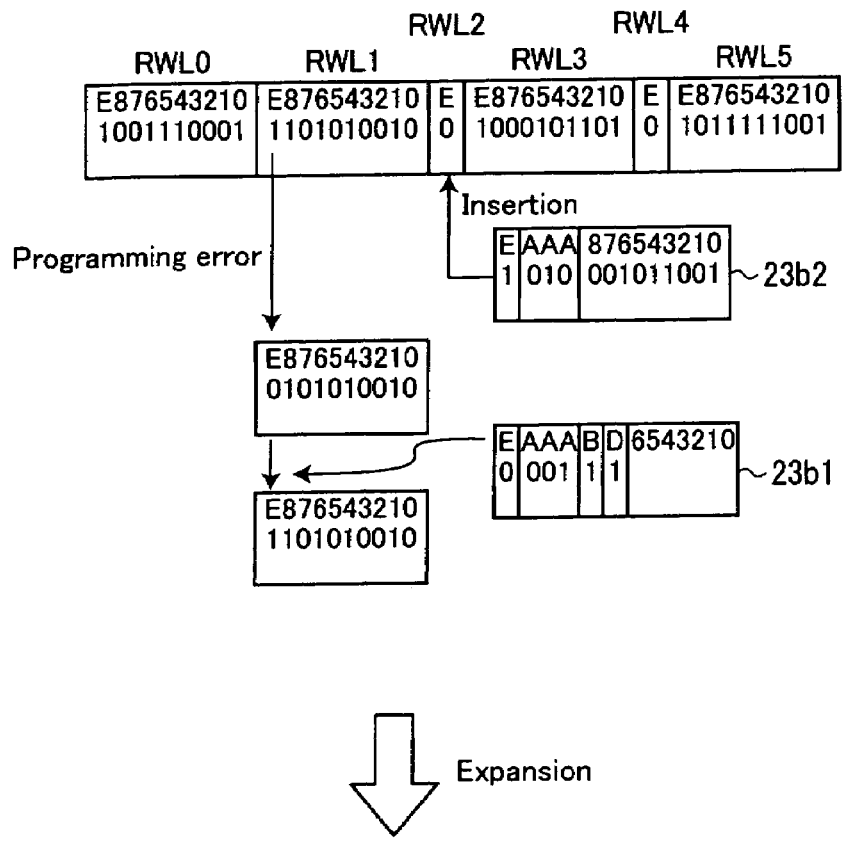
FIG. 14 is a view showing a first example of redundancy information to be written into first and second fuse and fuse latches in the memory of the second embodiment.

FIG. 14 shows an example of the first and second redundancy information programmed into the first and second fuse and fuse latches 23a and 23bi. In this example, description will be given of a case where the enable bit (E) of the fuse-set 1 (RWL1) is written to data "1" and new redundancy information (second redundancy information) is programmed into the fuse-set 2 (RWL2).

In the fuse-set included in the second fuse and fuse latches 23b1, as shown in FIG. 14, the data fuse (D) is programmed with data "1" and the address fuses (A) are programmed with the indicator bits which indicate the fuse-set 1. In the fuse-set included in the second fuse and fuse latches 23b2, the enable fuse (E) is programmed with data "1", the address fuses (A) are programmed with the indicator bits which indicate the fuse-set 2 and nine fuse elements subsequent to the address fuses (A) are programmed with nine-bits address bits. The address bits are used to designate an address that uses the row redundancy in the second redundancy step.

Moreover, data is assigned so that the plurality of fuse-sets (second fuse-sets) in the second fuse and fuse latches 23bi can be used together by the case where the second redundancy information is programmed and the case where the information used to modify the enable bit (E) is programmed. As shown in FIG. 14a, specifically, two fuse elements which store seventh and eighth bits of the address bits in the fuse-set programmed with the second redundancy information are used as the enable fuse (B) and the data fuse (D) in the fuse-set programmed with information used to modify the enable bit (E).

FIG. 14b shows redundancy information after having been expanded. In the example shown in FIG. 14, the indicator bits of the second fuse and fuse latch 23b2 are "010". In this case, the indicator bits indicate that the nine-bits data (address bits) subsequent thereto are to be inserted into the second data position.

In FIG. 14, the memory of the present embodiment has been described with reference to the case where new redundancy information is inserted into unused fuse-set (fuse-set whose data has been compressed) of the first fuse and fuse latch 23a. Alternately, however, the memory can modify the redundancy information programmed into the first fuse and fuse latch 23a by overwriting the redundancy information which has been already programmed into the first fuse and fuse latch 23a.

Figure 15:
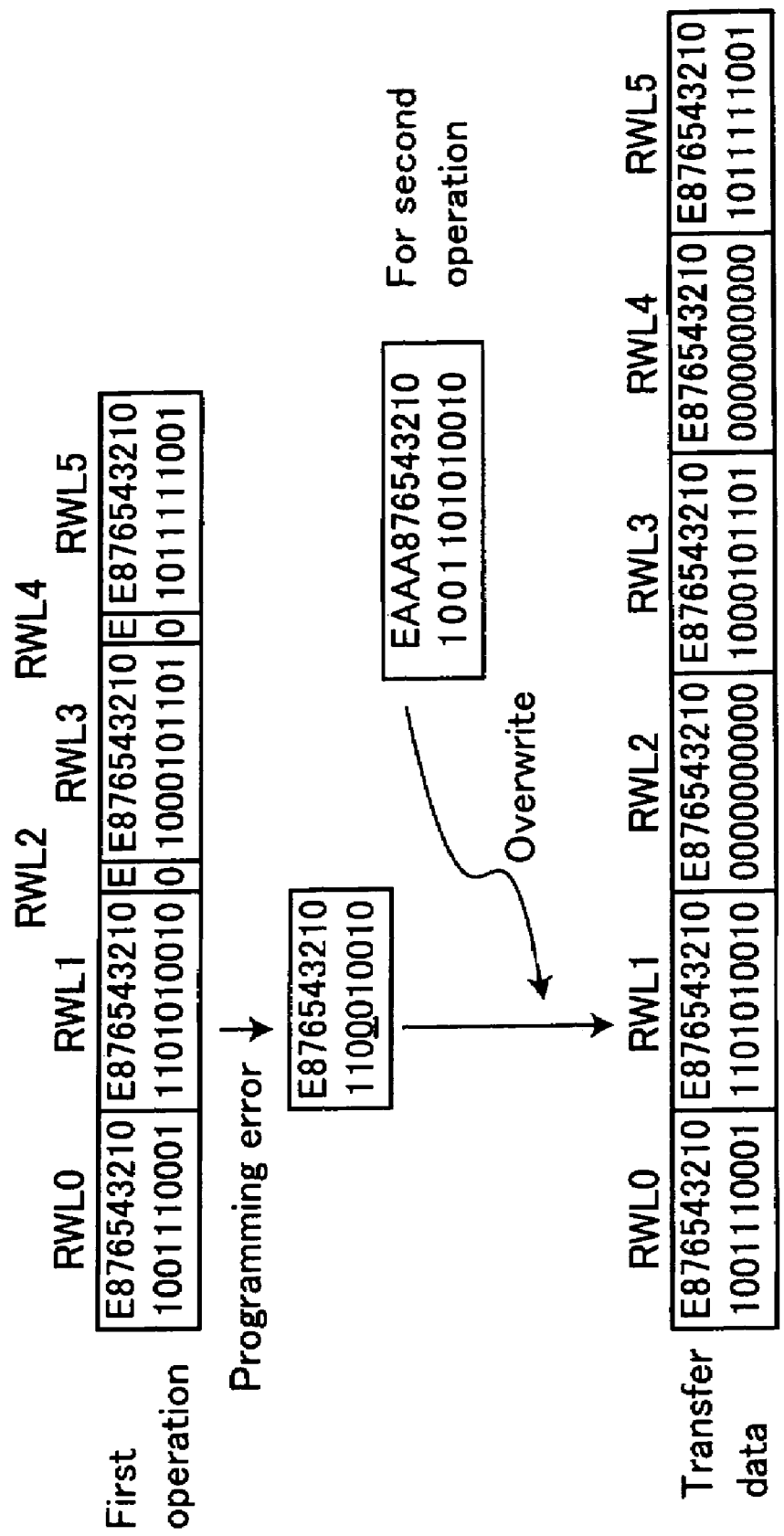
FIG. 15 is a view showing a second example of redundancy information to be written into first and second fuse and fuse latches in the memory of the second embodiment.

FIG. 15 shows an example of the redundancy information in the case where the redundancy information which has been already programmed into the first fuse and fuse latch 23a is overwritten. In this example, description will be given of a case where error occurs in the programming operation of the sixth address fuse in the fuse-set 1 when the fuse-set in the first fuse and fuse latch 23a is programmed.

In the fuse-set included in the second fuse and fuse latches 23b1, as shown in FIG. 15, the enable fuse (E) is programmed with data "1" and the address fuses (A) are programmed with the indicator bits which indicate the fuse-set 1. Furthermore, the address bits used to overwrite data of the fuse-set 1 are programmed in the fuse-set included in the second fuse and fuse latches 23b1.

In this example, the address bits are already written in the fuse-set 1 of the first fuse and fuse latch 23a. Upon reception of the an interrupt signal INTRPTi from the data insertion control circuit 30, the data transfer control circuit 25 gives priority to the data transferred from the second fuse and fuse latches 23bi, and supplies the data transferred from the second fuse and fuse latches 23bi to the memory macro 10. Therefore, the memory of the present embodiment can rewrite the address fuses in which the programming error occurs to correct data.

Figure 16:
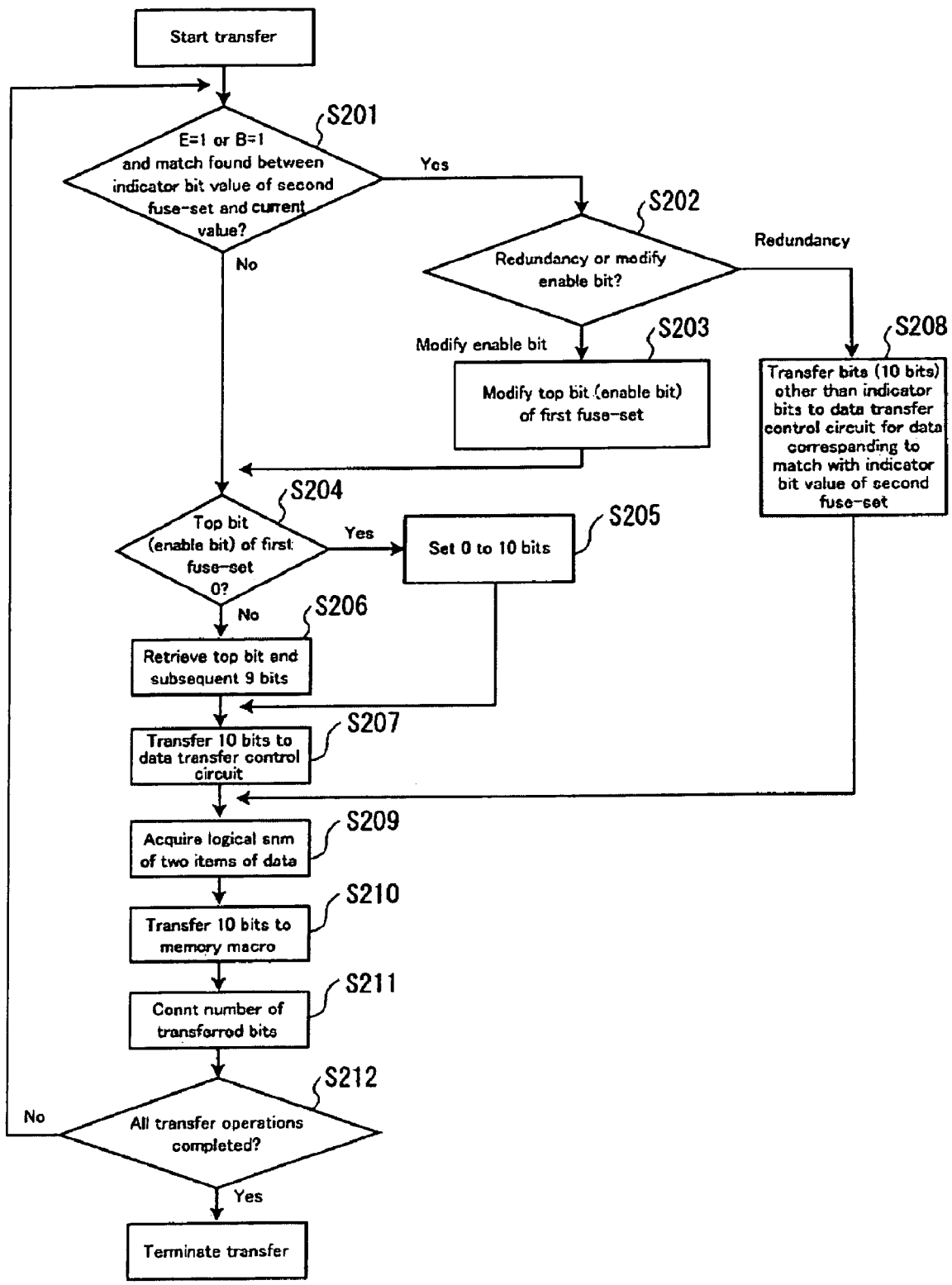
FIG. 16 is a flowchart showing an algorithm used when new redundancy information is created in the data transfer control circuit of the memory of the second embodiment.

FIG. 16 is a flowchart showing an algorithm used when new redundancy information is created in the data transfer control circuit 25. First, after start of transfer, comparison is performed between the transfer-clock value and values of indicator bits written in all the second fuse and fuse latches 23bi (Step S201). When a match is found in the comparison between the count output of the counter 24 and the indicator bit, the algorithm determines whether data programmed into the second fuse-set is the data used to insert the redundancy information or the data used to modify the enable bit (E) (Step S202). That is, the algorithm determines which one of the enable fuse (E) and the enable fuse (B) among the second fuse-set has been programmed.

If the data programmed into the second fuse-set is the data used to modify the enable bit (E), the top, i.e., enable bit (E), of data transferred from the first fuse and fuse latch 23a is modified based on the data bit (D) in the second fuse-set whose the indicator bits (A) matches to the count output of the counter 24 (Step S203). Next, the algorithm determines whether or not the top, i.e., enable bit (E), of data programmed into the first fuse and fuse latch 23a is data "0" (Step S204). If the enable bit is "0", then data composed of ten "0" bits are generated (Step S205). If the Enable bit is "1", a first bit and nine bits subsequent thereto are retrieved (Step S206). Then the ten bits of data are transferred to the data transfer control circuit 25 (Step S207).

If the data programmed into the second fuse-set is data used to insert the redundancy information, ten-bits data, i.e., data other than the indicator bits, are transferred to the data transfer control circuit 25 (Step S208). The data transfer control circuit 25 acquires the logical sum of the ten-bits data expanded from step S204 to step S207 and the ten-bits data acquired at step S208 in units of bit, whereby the data are combined into new redundancy information (Step S209) The new redundancy information is transferred to the memory macro 10 (Step S210). Then, the number of the transferred bits is counted (Step S211), and it is determined whether or not all transfer operations are completed (Step S212). If all the transfer operations are not yet completed, then the algorithm returns to Steps S201. If all the transfer operations are completed, then the transfer to the memory macro 10 terminates.

The memory of the present embodiment, similarly as the first embodiment, can compensate for the defective cell even if error occurs in the programming operation of the enable fuse (E).

Furthermore, in the memory of the present embodiment, the multiple fuse-data programming operations can be performed although the fuse data are compressed.

Moreover, in the memory of the present embodiment, independent fuse-sets are provided in the second-fuse and fuse latch 23bi and the monitor bits for the insertion of data are programmed into the respective fuse-set. In addition, the monitor bits are compared with the count output of the counter 24 during the transfer and the data to be programmed is inserted when a match is found in the comparison. Therefore, in the memory of the present embodiment, the number of the fuse elements used in the second redundancy step can be reduced and an occupation area of the fuse elements on the chip become smaller compared with the case where the fuse-sets used in the second redundancy step are provided corresponding to the redundancy word lines. Moreover, in the memory of the present embodiment, the multiple fuse-data programming operations can be performed without the restriction of the insertion data position.

Furthermore, the memory of the present embodiment can compensate for the defective cell by overwriting the address bits programmed into the first fuse and fuse latch 23a even if error occurs in the programming operation of the address fuse in the first fuse and fuse latch 23a.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first fuse-set configured to represent first information, wherein the first fuse-set includes at least one first fuse element having a state that represents whether the first information has been compressed; and
   a second fuse-set configured to represent second information, wherein the second fuse set includes at least one second fuse element having a state that represents data modification information for modifying the first information represented in the first fuse set.

2. The semiconductor device according to claim 1, further comprising:

an information creation circuit configured to modify the first information based on the data modification information and further expand the first information after being modified by the data modification information to create the second information.

3. The semiconductor device according to claim 1, wherein a first fuse of the first fuse-set is configured to store a first enable bit indicative of whether data stored in the first fuse-set has been compressed.

4. The semiconductor device according to claim 3, wherein the information creation circuit is configured to modify the first enable bit based on the data modification information.

5. The semiconductor device according to claim 4, wherein the second fuse-set is configured to store an indicator bit which indicates that the first enable bit stored in the first fuse-set is modified.

6. The semiconductor device according to claim 5, wherein the information creation circuit is configured to modify the first enable bit stored in the first fuse-set which the indicator bit is of a first predetermined state.

7. The semiconductor device according to claim 3, wherein:
the first fuse-set stores an address bit indicative of an address of a defective cell in a memory cell array replaced by a spare cell in a spare memory cell array; and
the second fuse-set stores a second enable bit which sets an operation mode of the information creation circuit.

8. The semiconductor device according to claim 7, the information creation circuit is configured to modify the first enable bit based on the data modification information when the second enable bit indicates a first operation mode, and the information creation circuit modifies the address bit based on the data modification information when the second enable bit indicates a second operation mode.

9. A semiconductor device comprising:
a memory cell array having a plurality of memory cells;
a spare memory cell array having a plurality of spare cells available to compensate for a detective cell in the memory cell array;
a first fuse-set configured to represent first redundancy information used to replace the defective cell by a spare cell of the plurality of spare cells in the spare memory cell array, wherein the first fuse-set includes at least one first fuse element having a state that represents whether the first redundancy information has been compressed; and
a second fuse-set configured to represent second information, wherein the second fuse set includes at least one second fuse element having a state that represents data modification information for modifying the first information represented in the first fuse set.

10. The semiconductor device according to claim 9, further comprising:
an information creation circuit configured to modify the first information based on the data modification information and further expand the first information after being modified by the data modification information to create the second information.

11. The semiconductor device according to claim 10, wherein a first fuse of the first fuse-set is configured to store a first enable bit indicative of whether whether data stored in the first fuse-set has been compressed.

12. The semiconductor device according to claim 11, wherein the information creation circuit is configured to modify the first enable bit based on the data modification information.

13. The semiconductor device according to claim 12, wherein the second fuse-set is configured to store an indicator bit which indicates that the first enable bit stored in the first fuse-sets is modified.

14. The semiconductor device according to claim 13, wherein the information creation circuit is configured to modify the first enable bit stored in the first fuse-set which the indicator bit is of a first predetermined state.

15. The semiconductor device according to claim 11, wherein the first fuse-set stores an address bit indicative of an address of a defective cell in a memory cell array replaced by a spare cell in a spare memory cell array; and
the second fuse-set stores a second enable bit which sets an operation mode of the information creation circuit.

16. The semiconductor device according to claim 15, the information creation circuit is configured to modify the first enable bit based on the data modification information when the second enable bit indicates a first operation mode, and the information creation circuit modifies the address bit based on the data modification information when the second enable bit indicates a second operation mode.

17. A semiconductor device comprising:
a memory having a cell with an address;
a first fuse set;
means for determining if said cell is defective;
means for representing first information with the first fuse set, including means for representing whether the first information has been compressed, said first information including the address of the cell when said first information is not compressed;
means for determining if there is an error in the means for representing whether the first information has been compressed; and
means for modifying the first information with data modification information when the means for representing includes the error.

18. A method for setting states of fuse elements in a semiconductor device, comprising steps of:
determining if a cell in a memory is defective;
setting an address of a replacement cell for saving in a first fuse set when in said determining step it is determined that said memory cell is defective;
including first information indicative of whether the address has been compressed;
determining if there is an error in the first information; and
modifying the first information with data modification information when an error has been determined to exist in the first information.

19. The method according to claim 18, wherein said setting step includes programming the first fuse set with the address and the first information.

20. The method according to claim 18, wherein said modifying step includes checking a state of a fuse in a second set of fuses against the first information to determine how to correct said error.

* * * * *